US010205468B2

(12) United States Patent
Ahn et al.

(10) Patent No.: US 10,205,468 B2
(45) Date of Patent: Feb. 12, 2019

(54) DECODING METHOD, APPARATUS, AND ALGORITHM FOR NONBINARY LDPC CODES (71) Applicant: Samsung Electronics Co., Ltd, Gyeonggi-do (KR)

(72) Inventors: Seok-Ki Ahn, Gyeonggi-do (KR); Kyeong-Cheol Yang, Pohang-si (KR); Sang-Min Kim, Gyeonggi-do (KR); Woo-Myoung Park, Suwon-si (KR); Min Sagong, Suwon-si (KR); Chi-Woo Lim, Gyeonggi-do (KR); Sung-Nam Hong, Anyang-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 52 days.

(21) Appl. No.: 14/686,629

(22) Filed: Apr. 14, 2015

(65) Prior Publication Data
US 2015/0295592 A1 Oct. 15, 2015

(30) Foreign Application Priority Data

Apr. 14, 2014 (KR) .......................... 10-2014-0043988

(51) Int. Cl.
*H03M 13/11* (2006.01)
*H03M 13/00* (2006.01)
(52) U.S. Cl.
CPC .... *H03M 13/1171* (2013.01); *H03M 13/1117* (2013.01); *H03M 13/6502* (2013.01); *H03M 13/6577* (2013.01)

(58) Field of Classification Search
CPC ......... H03M 13/1117; H03M 13/6577; H03M 13/6502; H03M 13/1171
See application file for complete search history.

(56) References Cited

U.S. PATENT DOCUMENTS

| 2010/0017676 | A1* | 1/2010 | Gross | H04L 1/0057 714/752 |
| 2013/0061107 | A1* | 3/2013 | Wang | H03M 13/1117 714/752 |
| 2014/0089757 | A1* | 3/2014 | Yang | H03M 13/112 714/752 |
| 2014/0341233 | A1* | 11/2014 | Lin | H04L 49/90 370/474 |

OTHER PUBLICATIONS

Wang, et al. "A simplified min-sum decoding algorithm for non-binary LDPC codes"; IEEE Transactions on Communications, Jul. 25, 2012; 26 pages.

* cited by examiner

*Primary Examiner* — Kyle Vallecillo (57) ABSTRACT

Provided is a method for decoding a non-binary (NB) low density parity check (LDPC) code at a user equipment (UE) that implements at least one variable nodes that receive a received signal of a wireless channel and deliver an input message to a check node and the check node that checks the input message and outputs an output message. The method includes receiving at least one input messages, generating a temporary vector by using the at least one input messages, searching for an element having a dominant value by checking the temporary vector, generating a configuration set, which is a check target, by using the element having the dominant value, and generating the output message by performing comparison with respect to the generated configuration set.

20 Claims, 11 Drawing Sheets

| q | a | REDUCTION RATE IN COMPLEXITY OF OUTPUT MESSAGE UPDATE PROCESS AT CHECK NODE | REDUCTION RATE IN COMPLEXITY OF ENTIRE DECODING PROCESS | DIFFERENCE IN FER PERFORMANCE |
|---|---|---|---|---|
| 32 | 1 | 93.3% | 78.2% | 0.42dB |
| | 2 | 86.9% | 72.8% | 0.15dB |
| | 3 | 80.6% | 67.6% | 0.06dB |
| | 5 | 68.8% | 57.7% | 0.01dB |
| 64 | 1 | 96.8% | 88.4% | 0.67dB |
| | 3 | 90.5% | 82.7% | 0.16dB |
| | 5 | 84.4% | 77.1% | 0.06dB |
| | 7 | 78.5% | 71.7% | 0.02dB |

DECODING METHOD, APPARATUS, AND ALGORITHM FOR NONBINARY LDPC CODES

CROSS-REFERENCE TO RELATED APPLICATION AND CLAIM OF PRIORITY

The present application is related to and claims benefit under 35 U.S.C. 119(a) to Korean Patent Application Serial number 10-2014-0043988, which was filed on Apr. 14, 2014 in the Korean Intellectual Property Office, the entire disclosure of which is hereby incorporated by reference.

TECHNICAL FIELD

Various embodiments of the present disclosure relate to a method, apparatus, and algorithm for providing low complexity in decoding of non-binary Low Density Parity Check (LDPC) codes.

BACKGROUND

A LDPC code has superior performance that is close to a channel capacity if a decoding algorithm based on iterative decoding. A Non-Binary (NB) LDPC code has a gain in terms of a channel capacity with compared to a binary LDPC code under various channel conditions and modulation schemes, and shows better performance for a codeword having a shorter length. However, the NB LDPC code has higher decoding complexity than that of the binary LDPC code, so that to use the NB LDPC code, a decoding algorithm having low complexity needs to be developed.

The above information is presented as background information only to assist with an understanding of the present disclosure. No determination has been made, and no assertion is made, as to whether any of the above might be applicable as prior art with regard to the present disclosure.

SUMMARY

To address the above-discussed deficiencies, it is a primary object to provide, for use in a decoding method, apparatus, and algorithm for providing low complexity without causing latency, in decoding of a NB LDPC code.

Moreover, various aspects of the present disclosure also provide a method, apparatus, and algorithm for decoding a NB LDPC code by taking into account a tradeoff between complexity and decoding performance.

Furthermore, various aspects of the present disclosure also provide a method, apparatus, and algorithm for effectively updating an output message of a check node in decoding of a NB LDPC code.

In addition, various aspects of the present disclosure also provide a method, apparatus, and algorithm for reducing calculation complexity by effectively reducing a configuration set of a check target, in decoding of a NB LDPC code.

Other objects to be provided in the present disclosure are understood by embodiments described below.

According to an aspect of the present disclosure, a method is provided for decoding a Non-Binary (NB) Low Density Parity Check (LDPC) code at a User Equipment (UE) that implements at least one variable nodes that receive a received signal of a wireless channel and deliver an input message to a check node and the check node that checks the input message and outputs an output message, the method including receiving at least one input messages, generating a temporary vector by using the at least one input messages, searching for an element having a dominant value by checking the temporary vector, generating a configuration set, which is a check target, by using the element having the dominant value, and generating the output message by performing comparison with respect to the generated configuration set.

According to another aspect of the present disclosure, a UE apparatus is provided for decoding a NB LDPC code by implementing at least one variable nodes that receive a received signal of a wireless channel and deliver an input message to a check node and the check node that checks the input message and outputs an output message, the UE apparatus including a controller implementing the check node configured to receive at least one input messages, generate a temporary vector by using the at least one input messages, search for an element having a dominant value by checking the temporary vector, generate a configuration set, which is a check target, by using the element having the dominant value, and generate the output message by performing comparison with respect to the generated configuration set.

Other aspects, advantages, and salient features of the disclosure will become apparent to those skilled in the art from the following detailed description, which, taken in conjunction with the annexed drawings, discloses various embodiments of the present disclosure.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

Throughout the drawings, like reference numerals will be understood to refer to like parts, components, and structures.

DETAILED DESCRIPTION

FIGS. 1 through 14, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged wireless communication device.

Although the present disclosure can be modified variously and have several embodiments, specific example embodiments are illustrated in the accompanying drawings and will be mainly described in the specification. However, the scope of the present disclosure is not limited to the specific embodiments and should be construed as including all the changes, equivalents, and substitutions included in the spirit and scope of the present disclosure.

Singular expressions such as "unless explicitly indicated otherwise" or "the" can be understood as including plural expressions. For example, "component surface" can include one or more component surfaces.

Relative terms referred to as illustrated in the drawings, such as a 'front surface', a 'rear surface', a 'top surface', a 'bottom surface', and the like, can be replaced with ordinal numbers such as "first", "second", and so forth. The order of components, such as "first", "second", and so forth, is the order in which they are mentioned or the arbitrarily set order, and can be changed arbitrarily. The terms are used for distinguishing one component from another component. For example, a first user device and a second user device are both user devices, and indicate different user devices. Also, a first component can be referred to as a second component and likewise, a second component also can be referred to as a first component, without departing from the teaching of the present disclosure.

Terms used in various embodiments of the present disclosure are intended to describe an exemplary embodiment, rather than to limit the various embodiments of the present disclosure. As used herein, the singular forms are intended to include the plural forms as well, unless the context clearly indicates otherwise. Terms "include" or "may include" used in various embodiments of the present disclosure indicate an existence of disclosed function, operation, or element, but do not limit an existence of one or more other functions, operations, or elements. Terms "include" or "has" used in the present disclosure should be understood that they are intended to indicate an existence of feature, number, step, operation, element, item or any combination thereof, disclosed in the specification, but should not be understood that they are intended to previously exclude an existence of one or more other features, numbers, steps, operations, elements, or any combination thereof or possibility of adding those things.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the specification with the context of the relevant art as understood by the artisan at the time of disclosure and will not be interpreted in an idealized or overly formal sense unless expressly so defined herein.

Prior to a detailed description of the present disclosure, examples of interpretable meanings of several terms used herein will be proposed, but they are not limited to interpretation examples provided below.

A User Equipment (UE) is an entity communicating with a Base Station (BS) or another UE, and be referred to as a UE, a Mobile Station (MS), a Mobile Equipment (ME), a device, a terminal, or the like.

Figure 1:
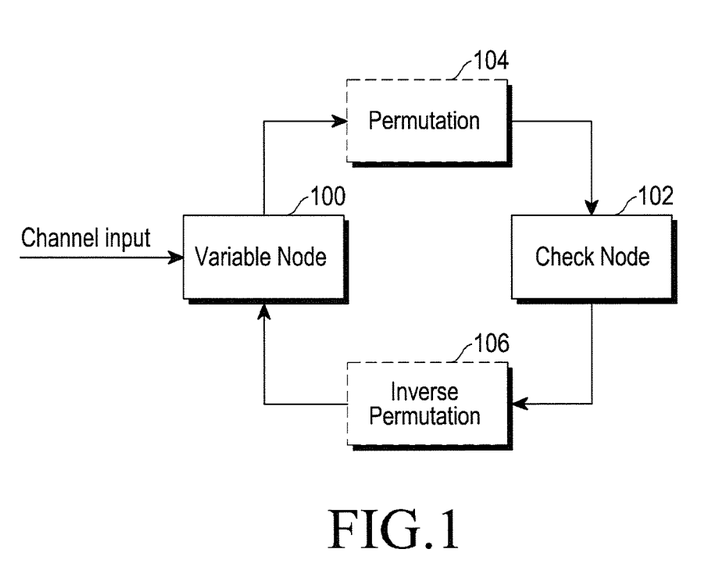
FIG. 1 illustrates a conceptual diagram simplifying a decoding operation of an LDPC code according to various embodiments of the present disclosure.

FIG. 1 illustrates an exemplary diagram of a decoding operation of an LDPC code according to various embodiment of the present disclosure.

A vector message for a codeword symbol of a NB LDPC code calculated from symbols received through a channel is input to a variable node 100. The variable node 100 performs a vector operation by using the input vector message and a vector message input from a check node 102, and delivers a vector message as the vector operation result to the check node 102. The check node 102 performs a vector operation with respect to the delivered vector message and delivers the vector operation result to the variable node 100. A permutation node 104 and an inverse permutation node 106 exist between the variable node 100 and the check node 102.

The codeword symbol of the NB LDPC code is an element on a Galois field GF(q) which is a NB finite field, and thus a message traveling during decoding is a vector having a length of q. As a result, a vector operation is performed in the variable node 100 and the check node 102, resulting in high decoding complexity, and in particular, the check node 102 has much higher complexity than the permutation node 104 or the variable node 100, making it difficult to implement a NB LDPC decoding apparatus.

Figure 2:
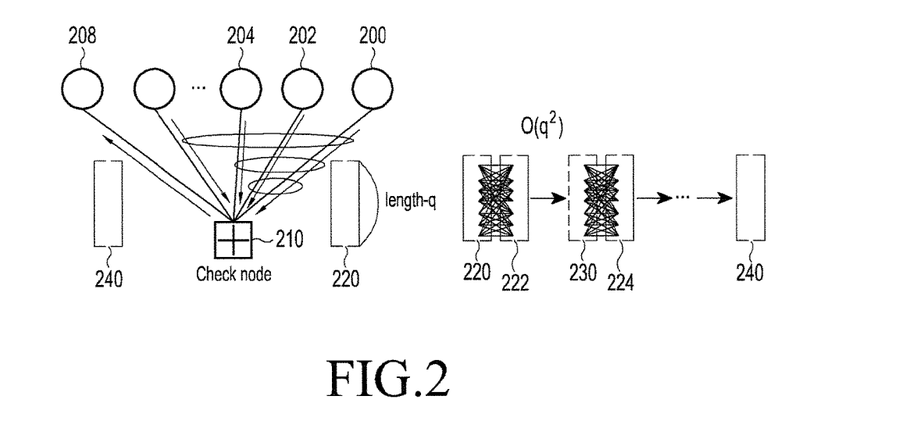
FIG. 2 illustrates a conceptual diagram of a vector operation of a check node during decoding of a NB LDPC codeword symbol based on a Min-Sum (MS) algorithm according to various embodiments of the present disclosure.

FIG. 2 illustrates a conceptual diagram of a vector operation of a check node during decoding of a NB LDPC codeword symbol based on a MS algorithm according to various embodiments of the present disclosure.

A check node 210 receives vectors 220, 222, and 224, each having a length of q, as messages from $(d_c-1)$ variable nodes 200, 202, and 204. $d_c$ represents a degree of a check node and also indicates the number of variable nodes exchanging messages during decoding of the check node. The check node 210 checks the messages input from the $(d_c-1)$ variable nodes 200, 202, and 204 to determine a vector (that is, a message) 240 having a high possibility of being a symbol of the remaining variable node 208, and delivers the determined message 240 to the variable node 208. The number of configuration sets as check targets that are calculated from the vectors input from the $(d_c-1)$ variable nodes 200, 202, and 204 is equal to $q^{(d_c-1)}$. For example, when a symbol is expressed as GF(64) and $d_c$ is 6, the number of configuration sets is about $10^9$. To reduce complexity caused by comparison for a large number of configuration sets, a Min-Sum (MS) algorithm reduces the number of configuration sets through forward or backward recursion.

Operations of the check node 210 are described in detail. The check node 210 checks a configuration set acquired by vector multiplication with respect to the vector 220 having a length of q received from the variable node 200 and the vector 222 having a length of q received from the variable node 202 to search for a dominant term, thus acquiring a temporary vector 230. In certain embodiments, due to multiplication with respect to vectors of a length q, the check node 210 has a complexity of $O(q^2)$, in which $O( )$ is a function expressing a complexity.

By making a check to search for a dominant term in a configuration set acquired by vector multiplication with respect to the acquired temporary vector 230 and the vector 224 having a length of q received from the variable node 204, the check node 210 acquires (or updates the temporary vector 230 with) a new temporary vector.

The check node 210 performs forward or backward recursion by sequentially repeating vector multiplication with respect to vectors received from all the variable nodes (that is, the $(d_c-1)$ variable nodes), and acquires a vector having a length of q and delivers the acquired vector as an output message to the variable node 208. The MS algorithm lowers a maximum value of complexity to some extent, but is accompanied by latency due to sequential repetition including q×q vector multiplication and check.

Figure 3:
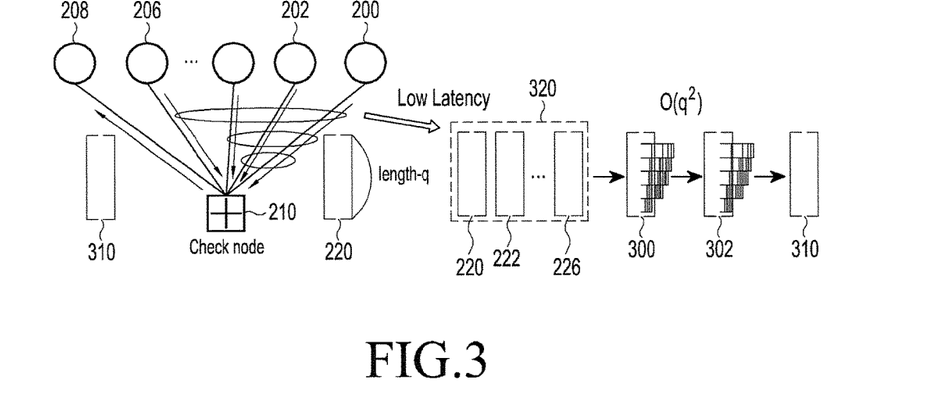
FIG. 3 illustrates a conceptual diagram of a vector operation of a check node during decoding of a NB LDPC codeword symbol based on a Simplified Min-Sum (SMS) algorithm according to various embodiments of the present disclosure.

FIG. 3 illustrates a conceptual diagram of a vector operation of a check node during decoding of a NB LDPC codeword symbol based on a Simplified Min-Sum (SMS) algorithm.

The check node 210 receives length-q vectors 220, 222, and 226 as messages input from $(d_c-1)$ variable nodes 200, 202, and 206. As described with reference to FIG. 2, the maximum number of configuration sets as check targets that are calculated from the vectors input from the $(d_c-1)$ variable nodes 200, 202, and 206 is equal to $q^{(d_c-1)}$. To reduce complexity caused by comparison with respect to such a large number of configuration sets, the check node 210 generates one temporary vector 300 including elements of dominant values (or dominant elements) collected from input messages 320 delivered from multiple variable nodes and then performs vector multiplication with the generated vector 300. Because of having already generated the temporary vector 300 by taking into account all the multiple input vectors, the check node 210 does not need to perform forward or backward recursion to acquire vectors from other variable nodes. The SMS algorithm does not have latency caused by forward or backward recursion.

Operations of the check node 210 will be described in detail. The check node 210 checks the length-q vectors 220, 222, and 226 received from the variable nodes 200, 202, and 206 to search for a dominant term, thus acquiring the temporary vector 300. The check node 210 checks the temporary vector 300 and a configuration set acquired by vector multiplication with respect to the temporary vector 300 to search for a dominant term, thus acquiring a length-q vector, and delivers the length-q vector as an output message 310 to the variable node 208. In FIG. 3, multiple connecting lines shown in the shape of stairs indicate that the temporary vector 300 performs vector multiplication with respect to its elements. Due to vector multiplication of the length-q temporary vector 300, the check node 210 has a complexity of $O(q^2)$.

To improve the accuracy of the output message, the check node 210 performs vector multiplication 302 and check with respect to the acquired temporary vector 230 additionally (once or twice), thereby updating a message to be delivered to the variable node 208. The SMS algorithm does not perform forward or backward recursion while having a complexity that is similar to that of the MS algorithm, thus having no latency.

In NB LDPC decoding, to reduce a theoretical maximum complexity of a check node, $q^{(d_c-1)}$, an Extended Min-Sum (EMS) algorithm and an SMS algorithm have been developed. However, the check node still has a complexity of $O(q^2)$ and thus the complexity of the check node is much higher than a binary LDPC code having no need for a length-q vector operation. This is because the check node 210 considers all of candidate configuration sets of which a number is proportional to $q^2$, in order to search for a value to be selected as the output message. Such a complexity of $O(q^2)$ acts as an obstacle to implementation of a terminal apparatus having limited capabilities.

To reduce the high complexity, the present disclosure proposes a method which enables a low-complexity operation of a check node by limiting configuration sets as check targets to a predetermined level in an output message update process of the check node. The present disclosure proposes a method for effectively reducing the number of candidate groups by using, at the check node, a feature of a value selected as the output message.

It has been discovered that values selected as the output messages to be delivered by the check node to the variable node are highly likely to include a dominant value or a significant value among input messages. To check a configuration set used by the check node to determine the output message, the present disclosure proposes a scheme for searching for at least one dominant values and checking a combination of the at least one dominant values and the other values as a configuration set. The scheme according to the present disclosure does not need to check all possible configuration sets, thereby reducing the complexity of the check node to $O(q)$.

The dominant value or the significant value is a larger value for a probability value and is a smaller value for relative value that is transformed with respect to a predetermined reference (the dominant value).

Figure 4:
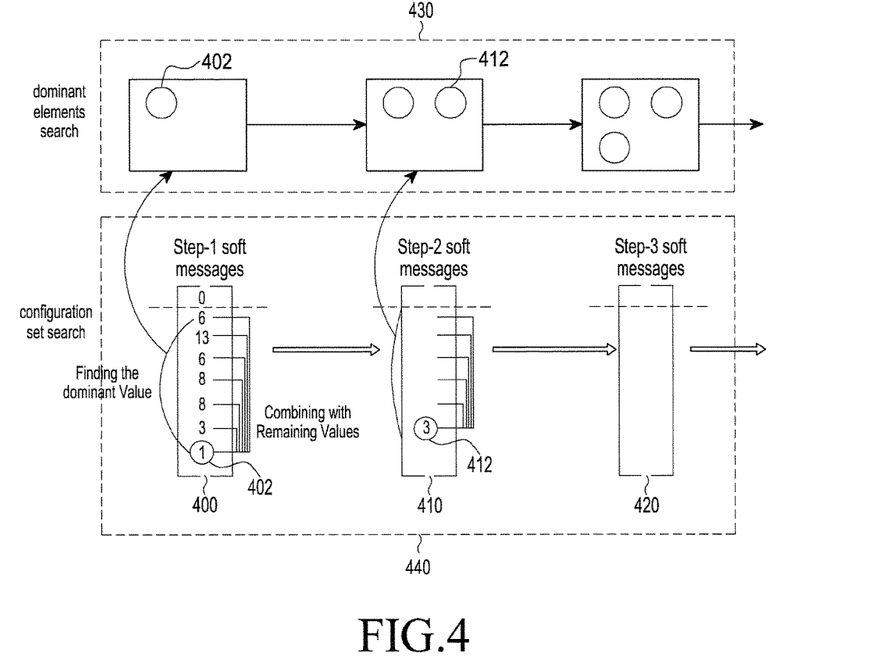
FIG. 4 illustrates a conceptual diagram of an operation of a check node during decoding of a NB LDPC codeword symbol according to various embodiments of the present disclosure.

FIG. 4 illustrates a conceptual diagram of an operation of a check node during decoding of a NB LDPC codeword symbol according to various embodiments of the present disclosure.

In certain embodiments, in a similar manner to the above-described SMS algorithm, the check node 210 receives input messages from variable nodes and generates one temporary vector 400. A procedure for generating the temporary vector 400 is described using a detailed embodiment with reference to FIG. 5, and will not be described in detail at this time.

In FIG. 4, operations 430 of searching for a term of a dominant value in a vector and operations 440 of generating a configuration set using the term of the dominant value and checking the configuration set are separately illustrated.

In Step 1, the check node 210 searches for an element 402 having a dominant value in the temporary vector 400 and generates a combination of the dominant element 402 and the remaining elements of the temporary vector 400 as a configuration set that is a check target. The check node 210 performs comparison with respect to the generated configuration set to generate an output message 410. Assuming a length-q vector, the configuration set is a combination of a dominant element and the remaining (q−2) elements, such that the number of cases is equal to 1×(q−2) and the calculation has a complexity of about O(q).

To determine an accurate output message, a process of updating the output message 410 is added. The check node 210 improves the accuracy of the output message through additional update using a dominant value.

The additional update operation will be described using the output message 410 in Step 2. More specifically, the check node 210 searches for an element 412 of a next-order dominant value and generates a combination of the next-order dominant element 412 and the remaining elements of the output message 410 as a configuration set that is a check target. The check node 210 performs comparison with respect to the generated configuration set to generate an output message 420. The dominant element 402 determined in Step 1 may be excluded from generation of the configuration set. Assuming a length-q vector, the configuration set is a combination of one dominant element and the remaining (q−3) elements, such that the number of cases is equal to 1×(q−3) and the calculation has a complexity of about O(q). Even when additional update is performed, the complexity of various embodiments of the present disclosure maintains O(q)+O(q)=O(q).

As the number (a) of output message update operations increases, the complexity of the check node increases and decoding performance also increases. As such, according to various embodiments of the present disclosure, by controlling the number (a) of update operations, various Performance-Complexity Tradeoffs (PCTs) is provided.

More specifically, the number of combinations of configuration sets and the number of comparison operations in the SMS algorithm is expressed as follows:

$$\left(\frac{3q}{4} - 2\right) \cdot (q-1), \tag{1}$$

where q represents a length of a message vector expressed as GF(q).

In various embodiments of the present disclosure described with reference to FIG. 4, the number of combinations of configuration sets is expressed as follows:

$$a(q-1) - \left(\frac{a(a+1)}{2}\right), \tag{2}$$

where a represents the number of dominant elements used for an output message update operation (that is, the number of repetitions of a message update operation) in various embodiments of the present disclosure described with reference to FIG. 4.

In various embodiments of the present disclosure described with reference to FIG. 4, the number of comparison operations is expressed as follows:

$$aq - \left(\frac{a(a+1)}{2}\right) \tag{3}$$

For example, for q=64 and a=5, the number of combinations and the number of comparison operations in the SMS algorithm are 2898, but in various embodiments described with reference to FIG. 4, the number of combinations is 300, showing a reduction of about 89.6% and the number of comparison operations is 605, showing a reduction of about 79.1%.

Figure 5:
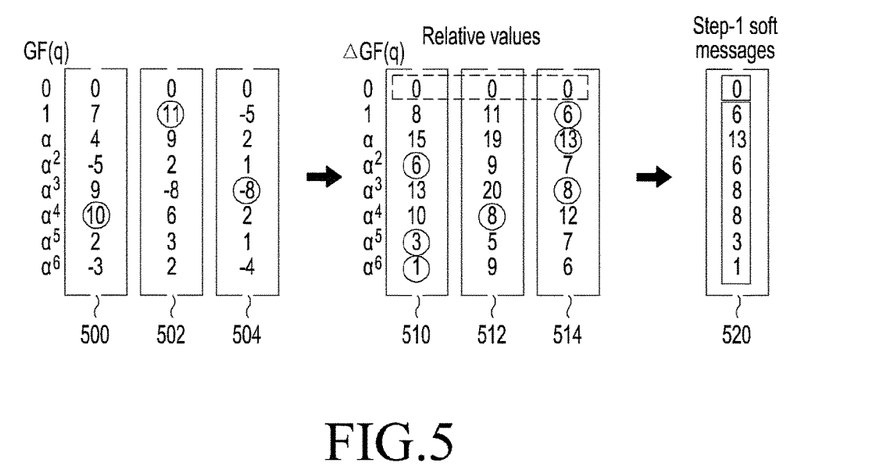
FIG. 5 illustrates a process of generating a temporary vector to generate an output message by using an input message according to various embodiments of the present disclosure.

FIG. 5 illustrates a process of generating a temporary vector to generate an output message by using an input message according to various embodiments of the present disclosure.

The check node 210 receives input messages 500, 502, and 504 delivered from variable nodes. The input messages 500, 502, and 504 are vectors expressed with a Galois field (GF(q)), and each element is a Log Density Ratio (LDR) message indicating a probability of a symbol being 0, a probability of a symbol being 1, a probability of a symbol being $\alpha^2$, a probability of a symbol being $\alpha^3$, or the like.

The check node 210 searches for dominant values in the input messages 500, 502, and 504. The dominant values are indicated by circles surrounding particular elements in the vectors 500, 502, and 504. To effectively search for a configuration set, the check node 210 expresses values of the vectors 500, 502, and 504 as relative values to generate vectors 510, 512, and 514.

The check node 210 selects elements (elements surrounded by circles) of the smallest value (that is, a dominant value) in each row of the vectors 510, 512, and 514 as the relative values to generate a temporary vector 520. The generated temporary vector 520 is used to generate, for example, the configuration set described with reference to FIG. 4.

Figure 6A:
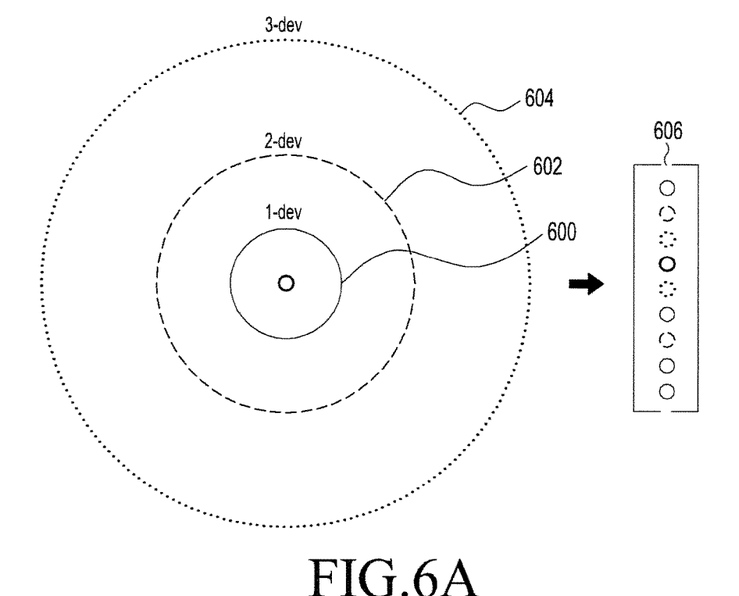
FIGS. 6A and 6B illustrate a size of a configuration set of a check node according to various embodiments of the present disclosure.
Figure 6B:
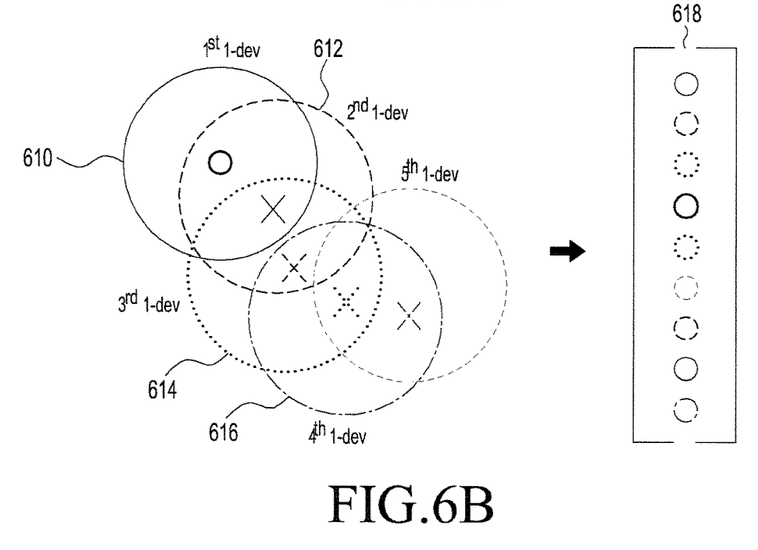

FIGS. 6A and 6B illustrate a size of a configuration set of a check node according to various embodiments of the present disclosure.

FIG. 6A illustrates an SMS algorithm. A configuration set having one different element than those of the most dominant configuration set will be expressed as a 1-deviation (1-dev) 600, a configuration set having two different elements than those of the most dominant configuration set as a 2-dev 602, and a configuration set having three different elements than those of the most dominant configuration set as a 3-dev 604. In case of the SMS algorithm, to calculate the configuration set 3-dev, a search has to be made over an area of a circle 604, thus determining an output message 606.

FIG. 6B illustrates various embodiments of the present disclosure in which an output message is updated. In certain embodiments of the present disclosure, the most dominant element and the remaining elements of a temporary vector are combined, such that only a configuration set 1-dev is checked at all times. In the $1^{st}$ 1-dev, a configuration set, which is a check target, is indicated by a circle 610. In the $2^{nd}$ 1-dev, a configuration set, which is a check target, is indicated by a circle 612. When an additional update operation is performed, configuration sets indicated by circles 614 and 616 are further checked and an output message 618 is generated. As shown in FIG. 6B, in various embodiments of the present disclosure, even when an update operation is repeated, the size of a configuration set does not sharply increase unlike in FIG. 6A, contributing to high efficiency in the amount of calculation.

Figure 7:
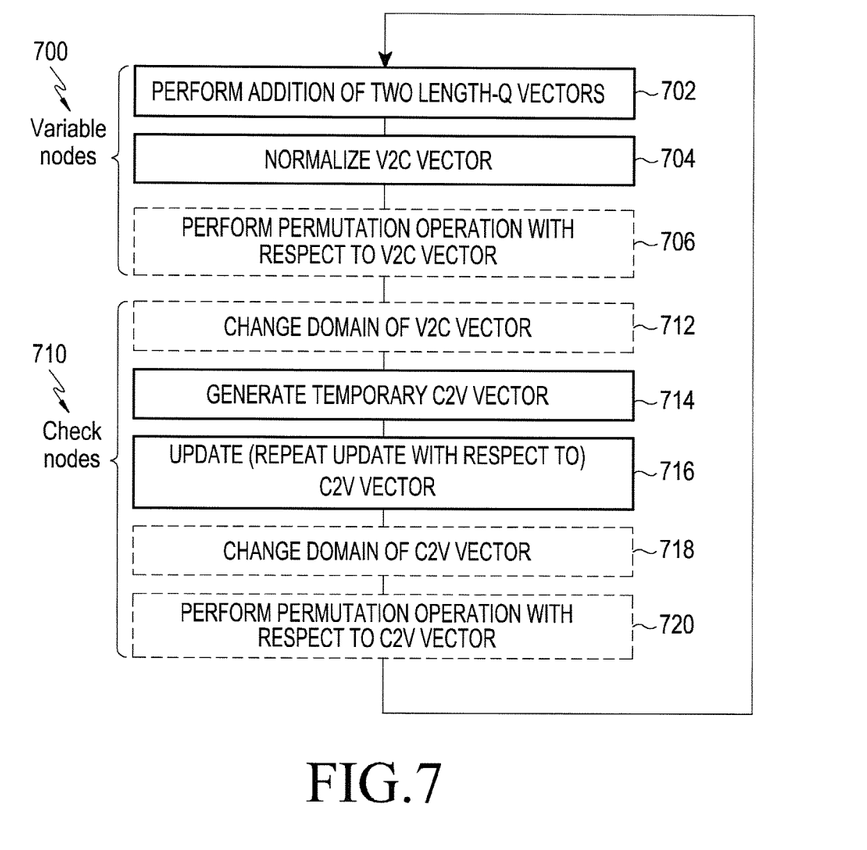
FIG. 7 illustrates operations of a variable node and a check node of a decoding apparatus according to various embodiments of the present disclosure.

FIG. 7 illustrates operations of a variable node and a check node of a decoding apparatus according to various embodiments of the present disclosure.

For convenience, operations 700 of variable nodes included in a decoding apparatus and operations 710 of check nodes included in the decoding apparatus are separately illustrated, but it should be noted that such illustrations do not add a limitation that a particular operation (for example, a domain change or permutation operation) has to be performed or the particular operation (for example, the domain change or permutation operation) has to be performed at a particular node.

In step 702, a variable node 700 performs a length-q vector addition operation. In step 704, the variable node 700 normalizes a variable node to check node (V2C) vector. In step 706, the variable node 700 performs a permutation operation with respect to the V2C vector.

In step 712, a check node 710, having received the V2C vector delivered from the variable node 700 as an input message, changes a domain of the V2C vector. In step 714, the check node 710 generates a temporary vector for a message update operation with respect to the domain-changed vector. In step 716, the check node 710 updates (and repeats an update operation with respect to) the temporary vector to generate an output message. In step 718, the check node 710 changes a domain of a check node to variable node (C2V) vector that is the output message. In step 720, the check node 710 performs a permutation operation with respect to the C2V vector or the domain-changed C2V vector.

Figure 8A:
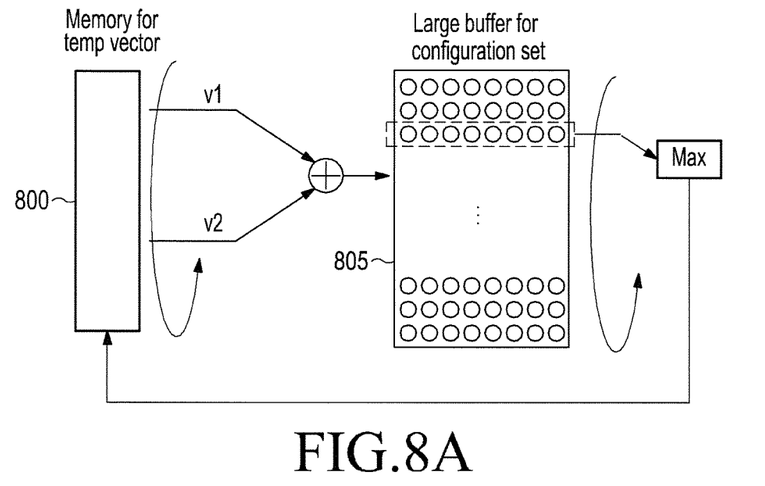
FIGS. 8A and 8B illustrate a memory resource necessary for checking a configuration set according to various embodiments of the present disclosure.
Figure 8B:
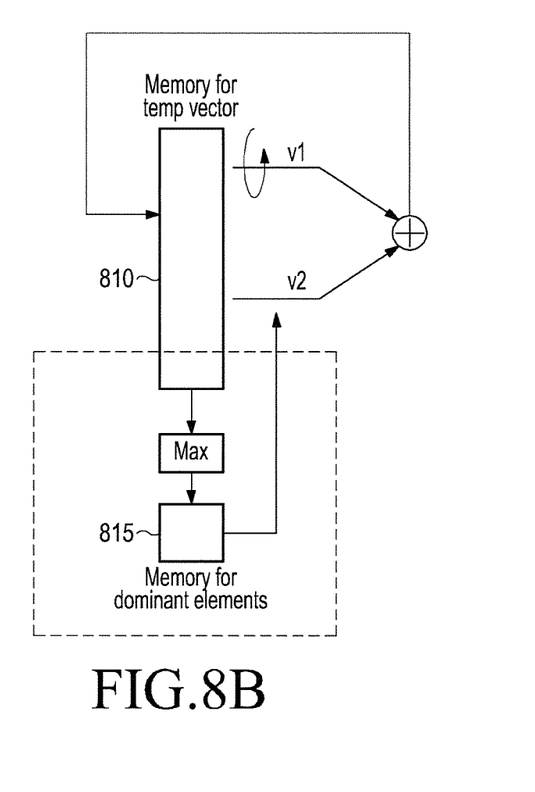

FIGS. 8A and 8B illustrate a memory resource necessary for checking a configuration set between an SMS algorithm and various embodiments of the present disclosure.

FIG. 8A illustrates a memory resource for an SMS algorithm. In addition to a memory 800 for a temporary vector, a large buffer 805 for a configuration set generated by vector multiplication with respect to the temporary vector is needed. Dominant elements in the buffer 805 are selected for a temporary vector and stored in the memory 800.

FIG. 8B illustrates a memory resource according to various embodiments of the present disclosure. In various embodiments of the present disclosure, a memory 810 for a temporary vector is also needed. A separate buffer having a large size like in the SMS algorithm is not needed. In certain embodiments, a small-size memory 815 for storing dominant elements in a temporary vector is necessary. When a message update operation is performed with respect to the temporary vector, a vector having the same size as the temporary vector is generated, such that the updated message is stored in the memory 810 for the temporary vector.

Figure 9A:
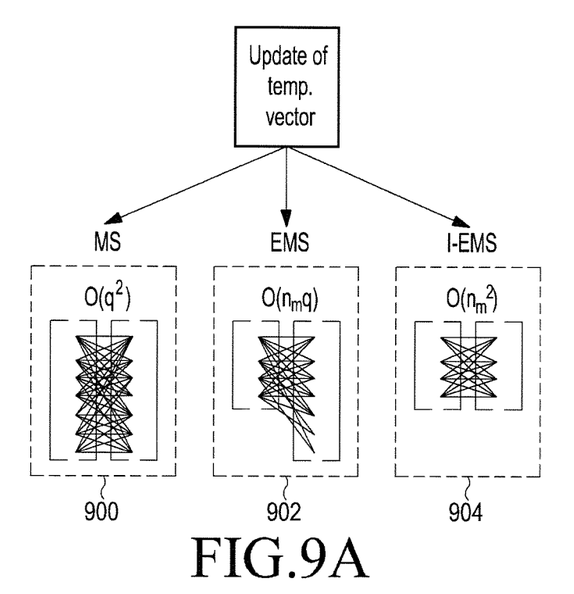
FIGS. 9A and 9B illustrate update schemes for a temporary vector of an LDPC decoding algorithm according to various embodiments of the present disclosure.
Figure 9B:
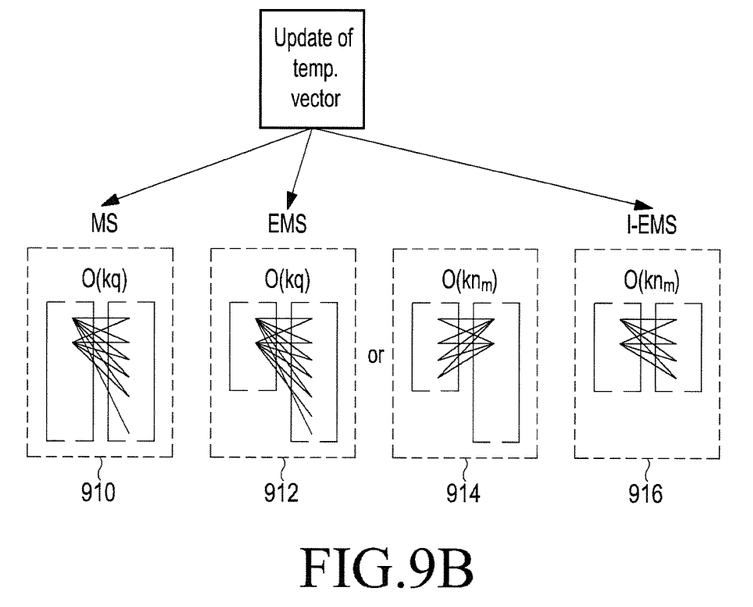

FIGS. 9A and 9B illustrate an update scheme for a temporary vector of an LDPC decoding algorithm according to various embodiments of the present disclosure.

FIG. 9A illustrates an update scheme for a temporary vector in three examples of an LDPC decoding algorithm.

In a MS algorithm 900, a q×q vector multiplication operation is performed with respect to a length-q temporary vector to generate a configuration set, and the generated configuration set is checked to update the temporary vector.

In an EMS algorithm 902, an $n_m \times q$ vector multiplication operation is performed with respect to a partial vector having a length of $n_m$ (being smaller than q) and a vector having a length of q to generate a configuration set and the generated configuration set is checked to update a temporary vector.

In an Improved-EMS (I-EMS) algorithm 904, an $n_m \times n_m$ vector multiplication operation is performed with respect to a partial vector having a length of $n_m$ being smaller than q to generate a configuration set and the generated configuration set is checked to update a temporary vector.

FIG. 9B illustrates an update scheme for a temporary vector by applying various embodiments of the present disclosure to the three examples of the LDPC decoding algorithm.

In an improved MS algorithm, instead of performing a q×q vector multiplication operation with respect to a length-q temporary vector to generate a configuration set, k dominant elements are selected from among elements of the temporary vector to calculate k×q configuration sets 910 for the selected elements. Because of k<q, the size of a configuration set is limited. A check node updates the temporary vector by checking the generated configuration sets.

In the EMS algorithm, by selecting k dominant elements from among elements of a length-q vector or a length-$n_m$ partial vector, k×q configuration sets 912 or $n_m \times k$ configuration sets 914 for the selected elements are calculated. Because of k<q and k<$n_m$, the size of a configuration set is limited. The check node checks the generated configuration sets to update the temporary vector.

In the I-EMS algorithm, k dominant elements are selected from among elements of a partial vector having a length of $n_m$ being smaller than q, thus calculating k×$n_m$ configuration sets 916 for the selected elements. The check node checks the generated configuration sets to update the temporary vector.

By using a method proposed by the present disclosure, decoding performance being close to the SMS algorithm is provided with a lower complexity than that of an existing SMS algorithm, and by controlling the number of update operations, various complexity or performance (that is, a performance-complexity tradeoff) of a desired level is obtained.

Figure 10:
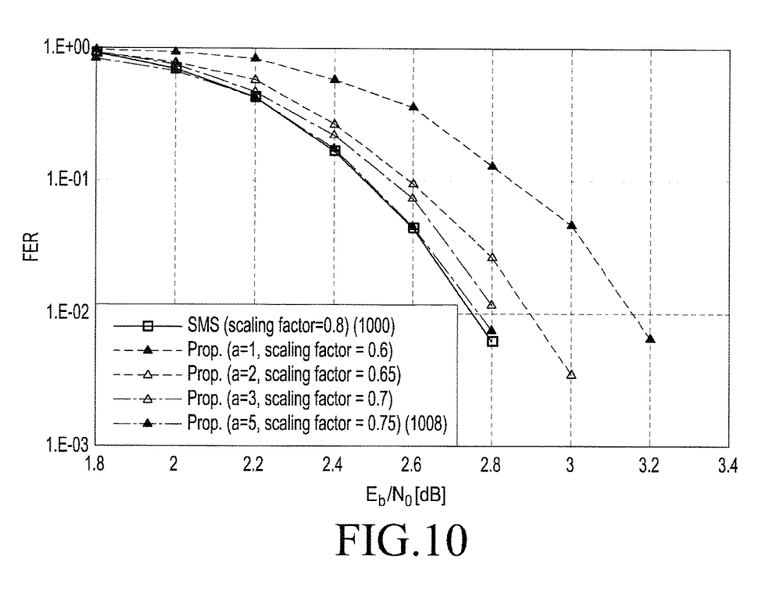
FIG. 10 illustrates a graph showing decoding performance for q=32 according to various embodiments of the present disclosure.
Figure 11:
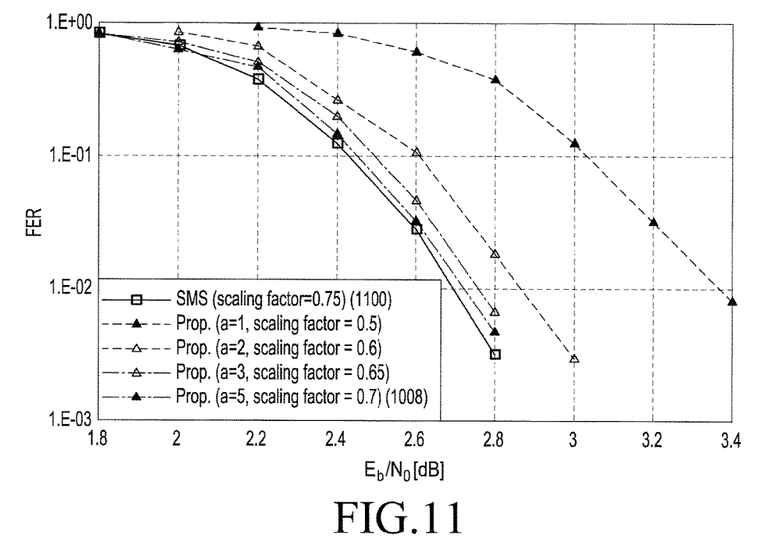
FIG. 11 illustrates a graph showing decoding performance for q=64 according to various embodiments of the present disclosure.
Figure 12:
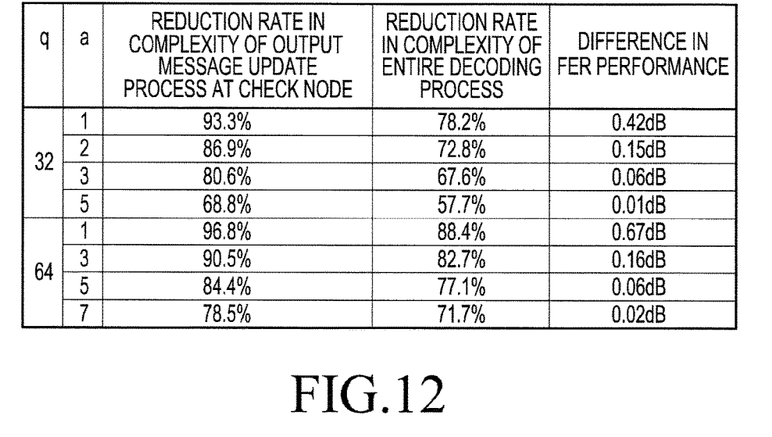
FIG. 12 illustrates a table for comparing performance and operation complexity between a message update scheme using a dominant value according to various embodiments of the present disclosure.

Referring to FIGS. 10 through 12, the performance of a method proposed by the present disclosure will be described. For reference, test results shown in FIGS. 10 to 12 have been obtained under a channel environment of a coding rate of ¾, an information bit length of 960, a vector length of GF(32) or GF(64), and a modulation scheme of Binary Phase Shift Keying (BPSK) or Additive White Gaussian Noise (AWGN), and the SMS algorithm checks a maximum of four deviations (the number of check node input messages).

FIG. 10 illustrates a graph showing decoding performance for q=32 according to various embodiments of the present disclosure.

FIG. 10 shows that update of an output message using a dominant value according to various embodiments of the present disclosure provides decoding performance close to that of SMS. In FIG. 10, to indicate decoding performance, Signal to Noise Ratio (SNR)-versus-Frame Error Rate (FER) has been used. The SNR has been expressed as an energy per information bit $E_b$ with respect to a noise power spectral density $N_0$. More specifically, for a vector length of 32, if a message is updated using five dominant elements (a=5) as indicated by 1008, an FER is similar with that of the SMS algorithm as indicated by 1000.

FIG. 11 illustrates a graph showing decoding performance for q=64 according to various embodiments of the present disclosure.

FIG. 11 also shows that update of an output message using a dominant value according to various embodiments proposed by the present disclosure provides decoding performance that is close to that of SMS. More specifically, for a vector length of 64, when a message is updated using seven dominant elements (a=7) as indicated by 1102, an FER is similar with that of the SMS algorithm as indicated by 1100.

FIG. 12 illustrates a table for comparing performance and operation complexity between a message update scheme using a dominant value according to various embodiments of the present disclosure.

In a table shown in FIG. 12, q represents a vector length and a represents the number of dominant values used for message update. Also, values provided in the table indicate results according to various embodiments of the present disclosure in comparison to the SMS algorithm.

For q=32, if a=1, the complexity of an output message update operation at a check node according to various embodiments of the present disclosure is reduced by 93.3% when compared to that of the SMS algorithm; if a=5, the complexity is reduced by 68.8%. A resulting FER difference is merely 0.01 dB for a=5. For a=1, the complexity of the entire decoding process is reduced by 78.2% in comparison to that of the SMS algorithm; for a=5, the complexity is reduced by 57.7%. According to various embodiments of the present disclosure, a reduction rate of the complexity for a=5 is smaller than that for a=1 and that the complexity for a=5 is higher than that for a=1.

For q=64, when a=1, the complexity of an output message update process at a check node according to various embodiments of the present disclosure is reduced by 96.8% when compared to that of the SMS algorithm; when a=7, the complexity is reduced by 78.5%. A resulting FER difference is merely 0.02 dB for a=7. Meanwhile, for a=1, the complexity of the entire decoding process is reduced by 88.4% in comparison to that of the SMS algorithm; for a=7, the complexity is reduced by 71.7%. According to various embodiments of the present disclosure, a reduction rate of the complexity for a=7 is smaller than that for a=1 and that the complexity for a=7 is higher than that for a=1.

Figure 13:
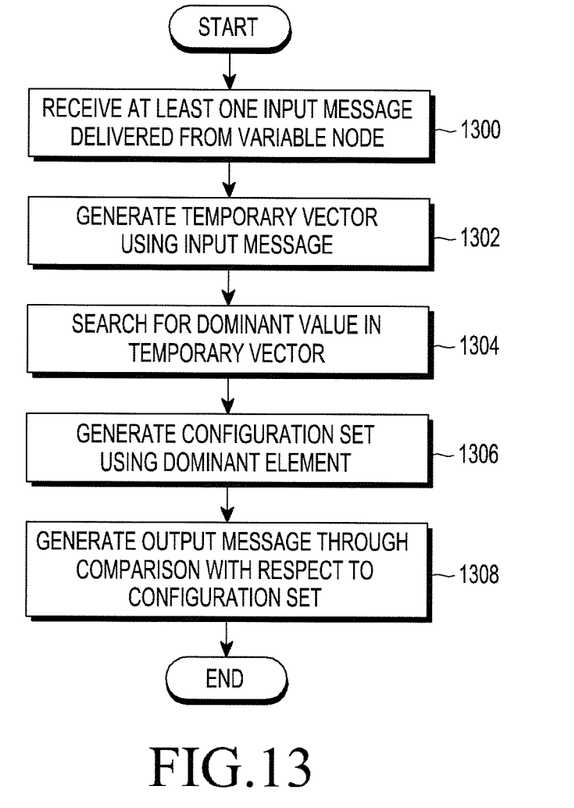
FIG. 13 illustrates operations of a check node implemented in a User Equipment (UE) according to various embodiments of the present disclosure.

FIG. 13 illustrates operations of a check node implemented in a UE according to various embodiments of the present disclosure.

In step 1300, a check node receives at least one input messages delivered from at least one variable nodes.

In step 1302, the check node generates a temporary vector by using the at least one input messages. The temporary vector is generated using the scheme described with reference to FIG. 5 or the scheme described with reference to FIG. 2. The check node generates a configuration set by performing vector multiplication with respect to two input messages, and generates the temporary vector by checking the generated configuration set. The check node checks the input message to search for a dominant value and determines a vector including only dominant values as the temporary vector.

In step 1304, the check node searches for a dominant value in the temporary vector.

In step 1306, the check node generates a configuration set by using an element corresponding to the dominant value of the temporary vector. For generation of the configuration set, only combinations of an element of the dominant value and remaining elements of the temporary vector are determined as the configuration set.

In step 1308, the check node generates an output message by performing comparison with respect to the generated configuration set. By performing an update operation with respect to the output message once or more, the accuracy of the output message is improved. By controlling the number of update operations, a tradeoff between decoding performance and decoding complexity is achieved. Update of the output message include searching for a next-order dominant value for the output message, generating a configuration set by using the next-order dominant value, and updating an output message by checking the generated configuration set.

Figure 14:
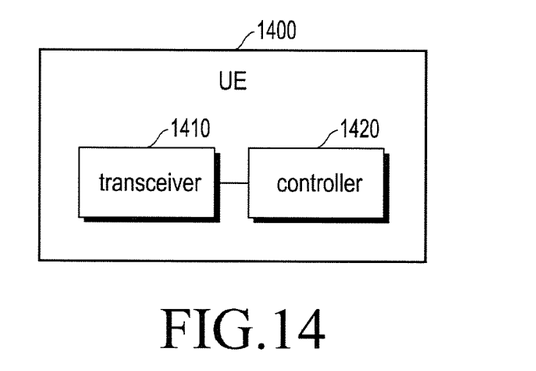
FIG. 14 illustrates a UE apparatus according to various embodiments of the present disclosure.

FIG. 14 illustrates a UE apparatus according to various embodiments of the present disclosure.

The UE apparatus 1400 includes a transceiver 1410 capable of receiving an encoded signal through a communication channel and a controller 1420 for decoding the encoded signal. The transceiver 1410 and the controller 1420 also can be implemented in a single component.

The controller 1420 is a component for implementing a variable node and a check node to decode an NB LDPC code described in the present disclosure. The above-described operations of the decoding algorithm at the variable node or the check node are understood as operations of the controller 1420.

It should be noted that the conceptual diagram of the decoding algorithm, the exemplary diagram of a vector operation, the flowchart of the variable node or check node, and the block diagram of the UE apparatus 1400 or the check node illustrated in FIGS. 2 through 14 are not intended to limit the scope of the present disclosure. That is, all operations, components, or operational steps provided in FIGS. 2 through 14 should not be interpreted as essential elements for carrying out the present disclosure, and by including some elements, the present disclosure can be carried out without deteriorating the gist of the present disclosure.

The above-described operations can be implemented by providing a memory device having a corresponding program code stored therein in an arbitrary component of a base station or a terminal apparatus of a communication system. That is, a controller of a base station or a terminal apparatus reads out and executes the program code stored in the memory device by a processor or a Central Processing Unit (CPU) to execute the above-described operations.

Various components, modules, and the like of the base station or the terminal apparatus described herein operate using a hardware circuit, for example, a Complementary Metal Oxide Semiconductor (CMOS) logic circuit, a hardware circuit such as a combination of firmware, software and/or hardware, a combination of firmware and/or software inserted into a machine-readable medium. For example, various electric structures and methods are carried out by using electric circuits such as transistors, logic gates, and on-demand semiconductors.

According to various embodiments of the present disclosure, a high complexity needed at a check node of an NB LDPC code decoding apparatus is significantly reduced without causing latency that occurs during decoding.

According to various embodiments of the present disclosure, by effectively reducing a candidate group in an output message update process at a check node of an NB LDPC code decoding apparatus, a complexity is reduced from $O(q^2)$ to $O(q)$.

According to various embodiments of the present disclosure, an NB LDPC code decoding apparatus provides various complexity-performance tradeoffs. Various performances with respect to complexity are selected depending on the number of output message update operations during decoding.

According to various embodiments of the present disclosure, by easily implementing decoding with respect to NB LDPC encoding, high-transmission-capacity NB coding transmission and reception are possible.

Other effects that can be acquired or expected from the embodiments of the present disclosure are explicitly or implicitly disclosed in the detailed description of the embodiment of the present disclosure. For example, various effects expected from the embodiments of the present disclosure have been disclosed in the detailed description of the present disclosure.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A method for reducing memory usage in implementing at least one variable node and a check node at a user equipment (UE), the UE including a processor, a transceiver and a memory, the method comprising:
    receiving, by the transceiver, a signal from a wireless channel;
    receiving, by the processor, at least one input message;
    generating, by the processor, a temporary vector by using the at least one input message;
    storing the temporary vector in a memory;
    determining, by the processor, a dominant value based on the temporary vector;
    storing the dominant value in the memory;
    determining, by the processor, a configuration set including an element having the dominant value;
    generating, by the processor, an output message by performing a comparison with respect to the configuration set including the element having the stored dominant value;
    determining, by the processor, a next-order dominant value based on the output message;
    storing the next-order dominant value in the memory;
    determining, by the processor, a new configuration set including an element having the stored next-order dominant value; and
    updating, by the processor, the output message by performing a comparison with respect to the new configuration set including the element having the stored next-order dominant value,
    wherein a number of combinations of configuration sets which are check targets and a number of comparison operations are determined based on a number of the dominant values.

2. The method of claim 1, wherein generating the configuration set comprises generating combinations of the element having the dominant value and remaining elements of the temporary vector as the configuration set.

3. The method of claim 1, wherein the input message and the output message are vectors having a length of q.

4. The method of claim 3, wherein determining the new configuration set comprises generating combinations of the element having the next-order dominant value and remaining elements of the output message as the new configuration set.

5. The method of claim 4, wherein the element having the dominant value is excluded from the remaining elements of the output message.

6. The method of claim 1, further comprising:
    storing the element having the dominant value of the temporary vector.

7. The method of claim 3, wherein a number of update operations with respect to the output message is changed.

8. The method of claim 1, wherein the input message and the output message are vectors having a length of q, and generating the temporary vector comprises:
    comparing the at least one input message to search for an element having a dominant value; and
    generating the temporary vector including the element having the dominant value.

9. The method of claim 1, wherein the input message and the output message are vectors having a length of q, and generating the temporary vector comprises:
    generating a temporary configuration set from as many input messages as a degree of the check node among the at least one input message; and
    checking the generated temporary configuration set to generate the temporary vector.

10. A user equipment (UE) apparatus implementing at least one variable nodes and a check node, the UE apparatus comprising:
    a transceiver configured to receive a signal from a wireless channel;
    a memory; and
    a processor configured to:
    receive, via the transceiver, at least one input message;
    generate a temporary vector by using the at least one input message;
    store the temporary vector in the memory;
    determine a dominant value based on the temporary vector;
    store the dominant value in the memory;
    determine a configuration set including an element having the stored dominant value;
    generate an output message by performing a comparison with respect to the configuration set including the element having the stored dominant value;
    determine a next-order dominant value based on the output message;
    store the next-order dominant value in the memory;
    determine a new configuration set including an element having the stored next-order dominant value; and
    update the output message by performing a comparison with respect to the new configuration set including the element having the stored next-order dominant value,
    wherein a number of combinations of configuration sets which are check targets and a number of comparison operations are determined based on a number of the dominant values.

11. The UE apparatus of claim 10, wherein the processor is configured to generate combinations of the element having the dominant value and remaining elements of the temporary vector as the configuration set.

12. The UE apparatus of claim 10, wherein the input message and the output message are vectors having a length of q.

13. The UE apparatus of claim 12, wherein the processor is configured to generate combinations of the element having the next-order dominant value and remaining elements of the output message as the new configuration set.

14. The UE apparatus of claim 13, wherein the element having the dominant value is excluded from the remaining elements of the output message.

15. The UE apparatus of claim 10, wherein the processor is configured to store the element having the dominant value of the temporary vector.

16. The UE apparatus of claim 12, wherein the processor is configured to change a number of update operations with respect to the output message.

17. The UE apparatus of claim 10, wherein the input message and the output message are vectors having a length of q, and
the processor is configured to:
compare the at least one input message to search for an element having a dominant value; and
generate the temporary vector including the element having the dominant value.

18. The UE apparatus of claim 10, wherein the input message and the output message are vectors having a length of q, and
the processor is configured to:
generate a temporary configuration set from as many input messages as a degree of the check node among the at least one input message; and
check the generated temporary configuration set to generate the temporary vector.

19. The method of claim 1, wherein the dominant value is a larger value for a probability value and a smaller value for a relative value.

20. The UE apparatus of claim 10, wherein the dominant value is a larger value for a probability value and a smaller value for a relative value.

* * * * *